(12) United States Patent
Moon et al.

(10) Patent No.: US 11,133,072 B2
(45) Date of Patent: *Sep. 28, 2021

(54) DATA STORAGE APPARATUS, AND INTERNAL VOLTAGE TRIMMING CIRCUIT AND TRIMMING METHOD THEREFOR

(71) Applicant: SK hynix Inc., Icheon-si (KR)

(72) Inventors: Young Jin Moon, Namyangju-si (KR); Young Sub Yuk, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 41 days.

This patent is subject to a terminal disclaimer.

(21) Appl. No.: 16/727,599

(22) Filed: Dec. 26, 2019

(65) Prior Publication Data

US 2021/0050065 A1 Feb. 18, 2021

(30) Foreign Application Priority Data

Aug. 12, 2019 (KR) ........................ 10-2019-0098188

(51) Int. Cl.
| | |
|---|---|
| *G11C 7/02* | (2006.01) |
| *G11C 16/30* | (2006.01) |
| *H03F 3/45* | (2006.01) |
| *H03K 5/24* | (2006.01) |

(Continued)

(52) U.S. Cl.
CPC ........ *G11C 16/30* (2013.01); *G11C 29/50004* (2013.01); *H03F 3/45* (2013.01); *H03K 5/24* (2013.01); *G11C 16/0483* (2013.01); *G11C 2029/5004* (2013.01); *H03F 2203/45156* (2013.01)

(58) Field of Classification Search
CPC ......... G11C 7/14; G11C 11/4099; G11C 7/12; G11C 11/16; G11C 11/413
USPC .................................................... 365/210.12
See application file for complete search history.

(56) References Cited

U.S. PATENT DOCUMENTS

| | | |
|---|---|---|
| 6,201,733 B1 | 3/2001 | Hiraki et al. |
| 6,324,103 B2 | 11/2001 | Hiraki et al. |
| 6,341,090 B1 | 1/2002 | Hiraki et al. |

(Continued)

FOREIGN PATENT DOCUMENTS

| | | |
|---|---|---|
| KR | 100909251 B1 | 7/2009 |
| KR | 101027501 B1 | 4/2011 |
| KR | 1020170044342 A | 4/2017 |

*Primary Examiner* — Quan Tra
(74) *Attorney, Agent, or Firm* — William Park & Associates Ltd.

(57) ABSTRACT

A data storage apparatus includes storage, and a controller including an internal voltage trimming circuit and controlling the storage in response to a request from a host. The trimming circuit may include an integral circuit sampling a difference between a test voltage output by a device under test and a reference voltage, generating an integral signal by integrating a sampled signal, and including an offset cancellation unit cancelling an offset from the sampled signal, a comparison circuit generating a comparison signal by comparing the integral signal with the reference voltage, a code generation circuit receiving an initial trimming code and generating preliminary trimming codes by increasing or decreasing the initial trimming code in response to the comparison signal, and a code average signal generation circuit generating the final trimming code by averaging the preliminary trimming codes for a given time and provide the final trimming code to the storage.

12 Claims, 12 Drawing Sheets

(51) Int. Cl.
    *G11C 29/50*     (2006.01)
    *G11C 16/04*     (2006.01)

(56) References Cited

U.S. PATENT DOCUMENTS

| | | |
|---|---|---|
| 7,031,217 B2 | 4/2006 | Hiraki et al. |
| 9,705,525 B1 * | 7/2017 | Singh .................. G05F 3/245 |
| 10,885,989 B1 * | 1/2021 | Moon .................. G11C 29/50 |
| 2001/0002884 A1 * | 6/2001 | Hiraki ............. G11C 29/50012 |
| | | 365/185.09 |
| 2006/0023548 A1 | 2/2006 | Hiraki et al. |
| 2019/0311773 A1 * | 10/2019 | Jimenez-Olivares ................ |
| | | G11C 29/021 |

* cited by examiner

DATA STORAGE APPARATUS, AND INTERNAL VOLTAGE TRIMMING CIRCUIT AND TRIMMING METHOD THEREFOR

CROSS-REFERENCE TO RELATED APPLICATION

The present application claims priority under 35 U.S.C. § 119(a) to Korean application No. 10-2019-0098188, filed on Aug. 12, 2019, in the Korean Intellectual Property Office, which is incorporated herein by reference in its entirety.

BACKGROUND

1. Technical Field

Various embodiments generally relate to a semiconductor integrated apparatus, and more particularly, to a data storage apparatus, and an internal voltage trimming circuit and trimming method for the data storage apparatus.

2. Related Art

A semiconductor apparatus is operated by an internal voltage generated from an external voltage supplied to the semiconductor apparatus. For stable operation of the semiconductor apparatus, an accurate internal voltage needs to be generated. The internal voltage may be generated at a target level through trimming, for example.

For voltage trimming, test equipment outside the semiconductor apparatus may be used. However, embedded test equipment called a built-in self-test (BIST) apparatus has been introduced because a test time using external equipment is directly connected to a test cost.

The BIST is a method of trimming a voltage to a target level through a circuit within the semiconductor apparatus, and can reduce the time and cost consumed for a test.

When the semiconductor apparatus operates, an internal voltage needs to be generated in a stable and robust manner because a malfunction attributable to external noise and a process parameter change cannot be excluded.

SUMMARY

In an embodiment, a data storage apparatus may include storage, and a controller including an internal voltage trimming circuit and configured to control the storage in response to a request from a host. The internal voltage trimming circuit may include an integral circuit configured to sample a difference between a test voltage output by a device under test (DUT) and a reference voltage and configured to generate an integral signal by integrating a sampled signal, the integral circuit including an offset cancellation unit configured to cancel an offset from the sampled signal, a comparison circuit configured to generate a comparison signal by comparing the integral signal with the reference voltage, a code generation circuit configured to receive an initial trimming code and to generate preliminary trimming codes by increasing or decreasing the initial trimming code in response to the comparison signal, and a code average signal generation circuit configured to generate a final trimming code by averaging the preliminary trimming codes for a given time and to provide the final trimming code to the storage.

In an embodiment, an internal voltage trimming circuit for providing a trimming code for generating an internal voltage of a semiconductor apparatus may include an integral circuit configured to sample a difference between a test voltage output by a device under test (DUT) and a reference voltage and configured to generate an integral signal by integrating a sampled signal, the integral circuit including an offset cancellation unit configured to cancel an offset from the sampled signal, a comparison circuit configured to generate a comparison signal by comparing the integral signal with the reference voltage, a code generation circuit configured to receive an initial trimming code and to generate preliminary trimming codes by increasing or decreasing the initial trimming code in response to the comparison signal, and a code average signal generation circuit configured to generate a final trimming code by averaging the preliminary trimming codes for a given time and to provide the final trimming code to the semiconductor apparatus.

In an embodiment, an internal voltage trimming method of an internal voltage trimming circuit for generating an internal voltage of a semiconductor apparatus may include sampling a difference between a test voltage output by a device under test (DUT) and a reference voltage, cancelling an offset from the sampled signal, generating an integral signal by integrating the sampled signal from which the offset has been cancelled, generating a comparison signal by comparing the integral signal with the reference voltage, generating preliminary trimming codes by increasing or decreasing an initial trimming code in response to the comparison signal, generating a final trimming code by averaging the preliminary trimming codes for a given time, and providing the final trimming code to the semiconductor apparatus.

DETAILED DESCRIPTION

Hereinafter, a data storage apparatus and an internal voltage trimming circuit and trimming method for the data storage apparatus are described below with reference to the accompanying drawings through various examples of embodiments.

Figure 1:
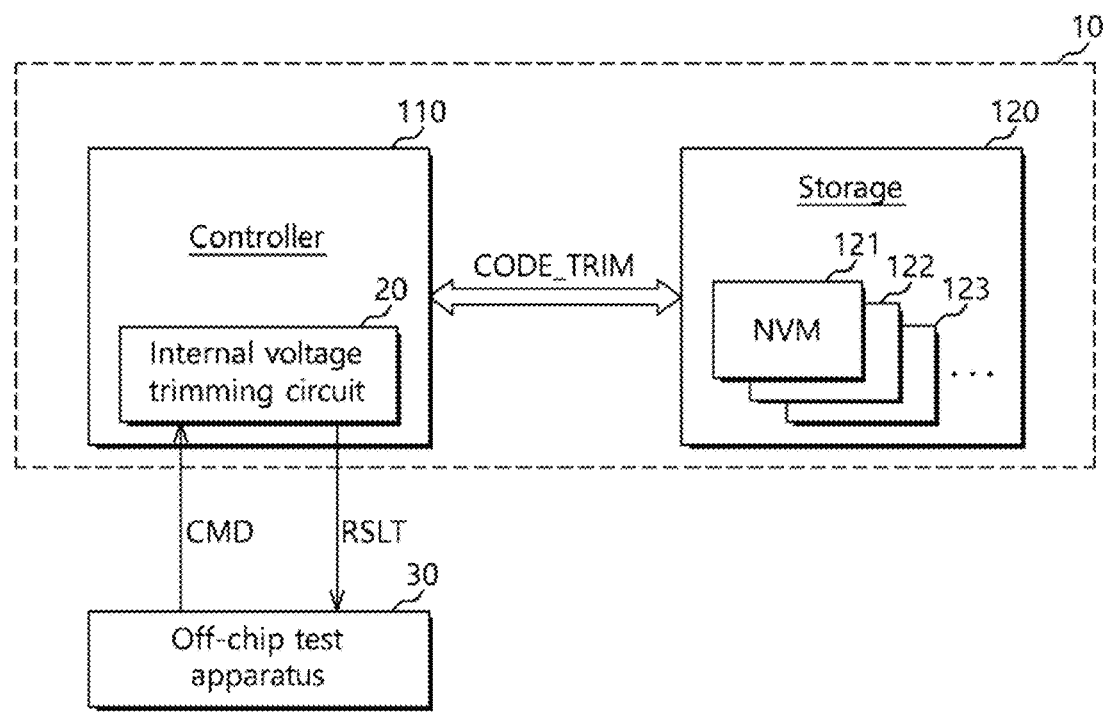
FIG. 1 illustrates a configuration of a data storage apparatus according to an embodiment.

FIG. 1 illustrates a configuration of a data storage apparatus 10 according to an embodiment.

Referring to FIG. 1, the data storage apparatus 10 includes a controller 110 and storage 120, and may operate under the control of a host apparatus (not illustrated).

The controller 110 may control the storage 120 in response to a request from the host apparatus. For example, the controller 110 may control data to be programmed in the storage 120 in response to a write request from the host apparatus. Furthermore, the controller 110 may provide the host apparatus with data written in the storage 120 in response to a read request from the host apparatus.

The storage 120 may write data or output written data under the control of the controller 110. The storage 120 may be configured with a volatile or non-volatile memory apparatus. In one embodiment, the storage 120 may be implemented using a memory device selected from various non-volatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin torque transfer magnetic RAM (STT-MRAM). The storage 120 may include a plurality of non-volatile memory apparatuses (NVMs) 121, 122, 123, . . . . Each of the NVMs may include a plurality of dies Die 0 to Die n, or a plurality of chips, or a plurality of packages. Moreover, the storage 120 may be operated as a single-level cell in which data of one bit is stored in a single memory cell or a multi-level cell in which data of a plurality of bits is stored in a single memory cell.

The storage 120 may be supplied with an internal voltage trimming code CODE_TRIM from the controller 110 and generate an internal voltage in order to perform a program, erase, or read operation under the control of the controller 110.

The controller 110 may be provided with an internal voltage trimming circuit 20.

The internal voltage trimming circuit 20 is electrically coupled to an off-chip test apparatus 30, in another aspect, an external tester. The internal voltage trimming circuit 20 may perform a test operation, such as an operation of generating an internal voltage trimming code CODE_TRIM in response to a test command CMD from the off-chip test apparatus 30, and may provide a test result RSLT to the off-chip test apparatus 30.

In one embodiment, the internal voltage trimming circuit 20 may be implemented in the form of a BIST apparatus. Accordingly, various tests including an internal voltage trimming operation may be performed in an on-chip. The internal voltage trimming circuit 20 may provide the off-chip test apparatus 30 with a test result RSLT after completing the trimming operation.

An internal voltage trimming code CODE_TRIM determined by the internal voltage trimming circuit 20 may be stored in control logic 260 of the storage 120, and may be used for an internal operation of the storage 120, such as a program, erase, or read operation.

Figure 2:
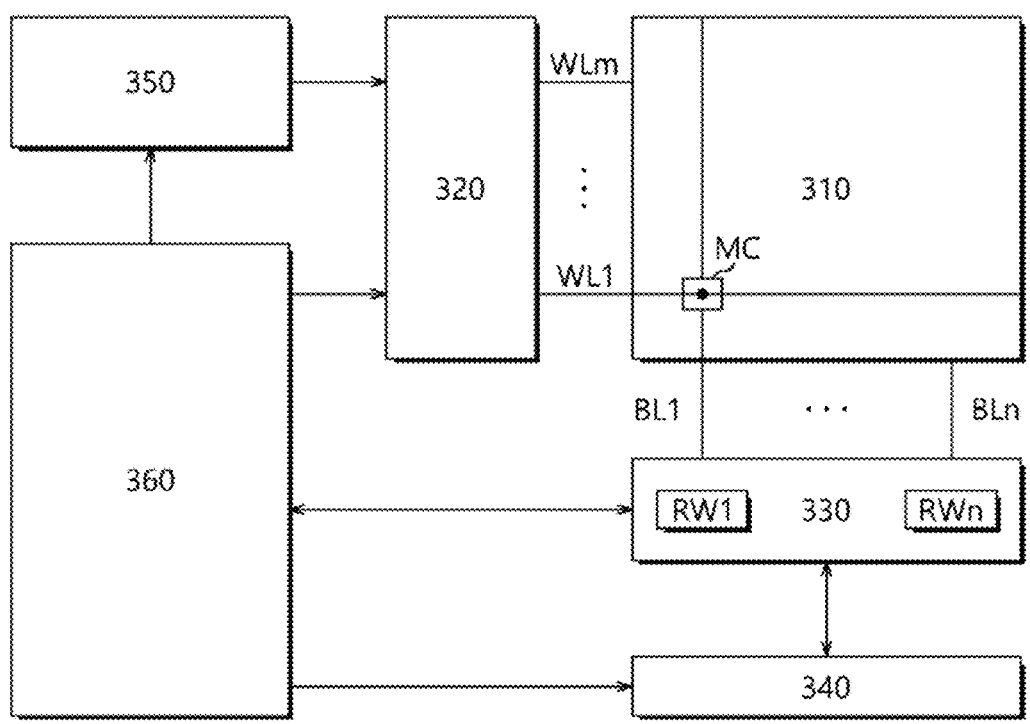
FIG. 2 illustrates a configuration of a non-volatile memory apparatus included in the data storage apparatus according to an embodiment.

FIG. 2 illustrates a configuration of an NVM included in the data storage apparatus according to an embodiment.

FIG. 2 is a block diagram illustrating a nonvolatile memory apparatus 300 included in a data storage apparatus, such as the data storage apparatus 10, in accordance with an embodiment. Referring to FIG. 2, the nonvolatile memory apparatus 300 may include a memory cell array 310, a row decoder 320, a data read/write block 330, a column decoder 340, a voltage generator 350, and control logic 360.

The memory cell array 310 may include memory cells MC which are arranged at areas where word lines WL1 to WLm and bit lines BL1 to BLn intersect with each other.

The memory cell array 310 may comprise a three-dimensional memory array. The three-dimensional memory array, for example, has a stacked structure by perpendicular direction to the flat surface of a semiconductor substrate. Moreover, the three-dimensional memory array means a structure including NAND strings which memory cells comprised in NAND strings are stacked perpendicular to the flat surface of a semiconductor substrate.

The structure of the three-dimensional memory array is not limited to the embodiment indicated above. The memory array structure can be formed in a highly integrated manner with horizontal directionality as well as vertical directionality. In an embodiment, in the NAND strings of the three-dimensional memory array memory cells are arranged in the horizontal and vertical directions with respect to the surface of the semiconductor substrate. The memory cells may be variously spaced to provide different degrees of integration The row decoder 320 may be coupled with the memory cell array 310 through the word lines WL1 to WLm. The row decoder 320 may operate under the control of the control logic 360. The row decoder 320 may decode an address provided by an external device (not shown). The row decoder 320 may select and drive the word lines WL1 to WLm, based on a decoding result. For instance, the row decoder 320 may provide a word line voltage, provided by the voltage generator 350, to the word lines WL1 to WLm.

The data read/write block 330 may be coupled with the memory cell array 310 through the bit lines BL1 to BLn. The data read/write block 330 may include read/write circuits RW1 to RWn, respectively, corresponding to the bit lines BL1 to BLn. The data read/write block 330 may operate under the control of the control logic 360. The data read/write block 330 may operate as a write driver or a sense amplifier, according to an operation mode. For example, the data read/write block 330 may operate as a write driver, which stores data provided by the external device in the memory cell array 310 in a write operation. For another example, the data read/write block 330 may operate as a sense amplifier, which reads out data from the memory cell array 310 in a read operation.

The column decoder 340 may operate under the control of the control logic 360. The column decoder 340 may decode an address provided by the external device. The column decoder 340 may couple the read/write circuits RW1 to RWn of the data read/write block 330, respectively corresponding to the bit lines BL1 to BLn, with data input/output lines or data input/output buffers, based on a decoding result.

The voltage generator 350 may generate voltages to be used in internal operations of the nonvolatile memory apparatus 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory apparatus 300, based on control signals provided by the external device. For example, the control logic 360 may control operations of the nonvolatile memory apparatus 300 such as read, write, and erase operations of the nonvolatile memory device 300. The control logic 360 may be implemented as hardware, software, or a combination of hardware and software. For example, the control logic 360 may be a control logic circuit operating in accordance with an algorithm and/or a processor executing control logic code.

An internal voltage trimming code CODE_TRIM provided by the controller 110 may be stored in a ROM within the control logic 360. A voltage generator 350 may generate an internal voltage based on the internal voltage trimming code CODE_TRIM.

In one embodiment, in comparing an output voltage of a device under test (DUT) and a reference voltage in order to detect an internal voltage trimming code, the internal voltage trimming circuit 20 may use an offset cancelled integrator in order to exclude an influence attributable to external noise and a process parameter change.

That is, the internal voltage trimming circuit 20 may integrate a difference between the output voltage of the DUT and the reference voltage through the offset cancelled integrator, and increase or decrease the internal voltage trimming code based on a result of a comparison between an output voltage of an integral circuit and the reference voltage. Furthermore, the internal voltage trimming circuit 20 may generate a final trimming code by averaging internal voltage trimming codes output for a given time.

Figure 3:
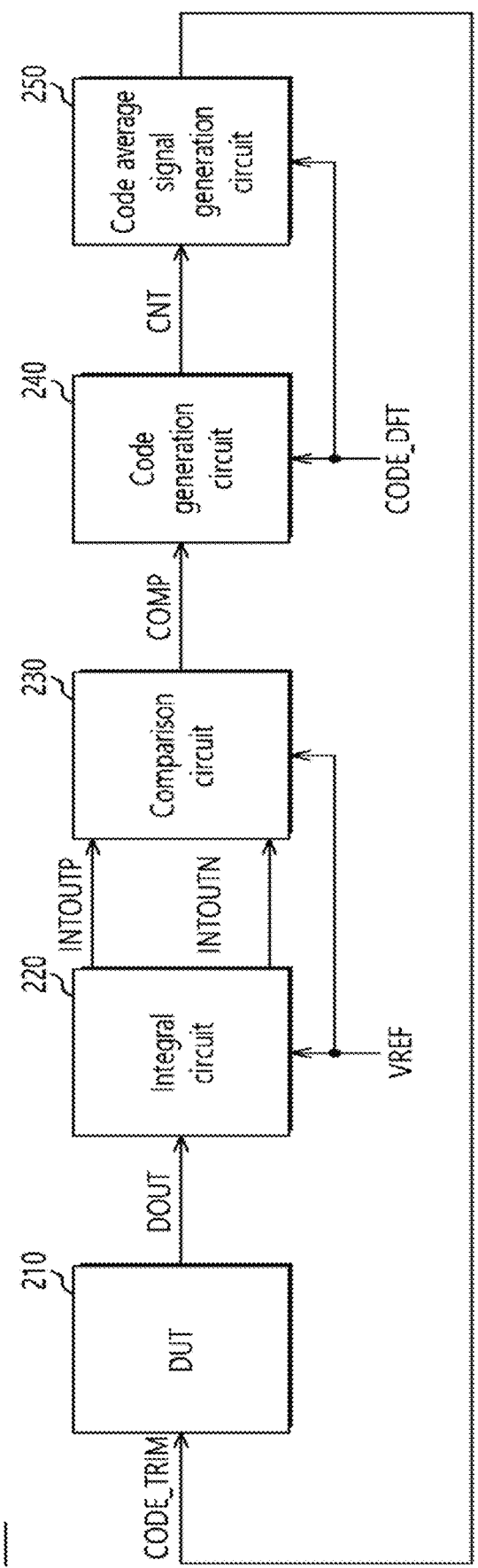
FIG. 3 illustrates a configuration of an internal voltage trimming circuit according to an embodiment.

FIG. 3 illustrates the configuration of the internal voltage trimming circuit according to an embodiment.

Referring to FIG. 3, the internal voltage trimming circuit 20 may include a DUT 210, an integral circuit 220, a comparison circuit 230, a code generation circuit 240, and a code average signal generation circuit 250.

The DUT 210 may be configured to output a test voltage DOUT in response to a trimming code CODE_TRIM.

The integral circuit 220 may be configured to integrate a difference between the test voltage DOUT output by the DUT 210 and a reference voltage VREF.

In one embodiment, the integral circuit 220 may be configured to generate differential integral signals INTOUTP and INTOUTN by receiving differential input signals generated from the test voltage DOUT, but is not limited thereto.

The comparison circuit 230 may be configured to receive the differential integral signals INTOUTP and INTOUTN from the integral circuit 220 and generate a comparison signal COMP by comparing the differential integral signals INTOUTP and INTOUTN with the reference voltage VREF.

The code generation circuit 240 may be configured to receive an initial trimming code CODE_DFT and output preliminary trimming codes CNT by increasing or decreasing the initial trimming code CODE_DFT in response to the comparison signal COMP. In one embodiment, the code generation circuit 240 may be a counter circuit, but is not limited thereto.

The code average signal generation circuit 250 may be configured to generate the final trimming code CODE_TRIM by averaging the preliminary trimming codes CNT output for a given time.

In one embodiment, the integral circuit 220 may use an offset cancelled integrator in order to exclude an influence attributable to external noise and a process parameter change in comparing the output voltage DOUT of the DUT 210 and the reference voltage VREF. The integral circuit 220 may be configured as illustrated in FIG. 4, for example.

Figure 4:
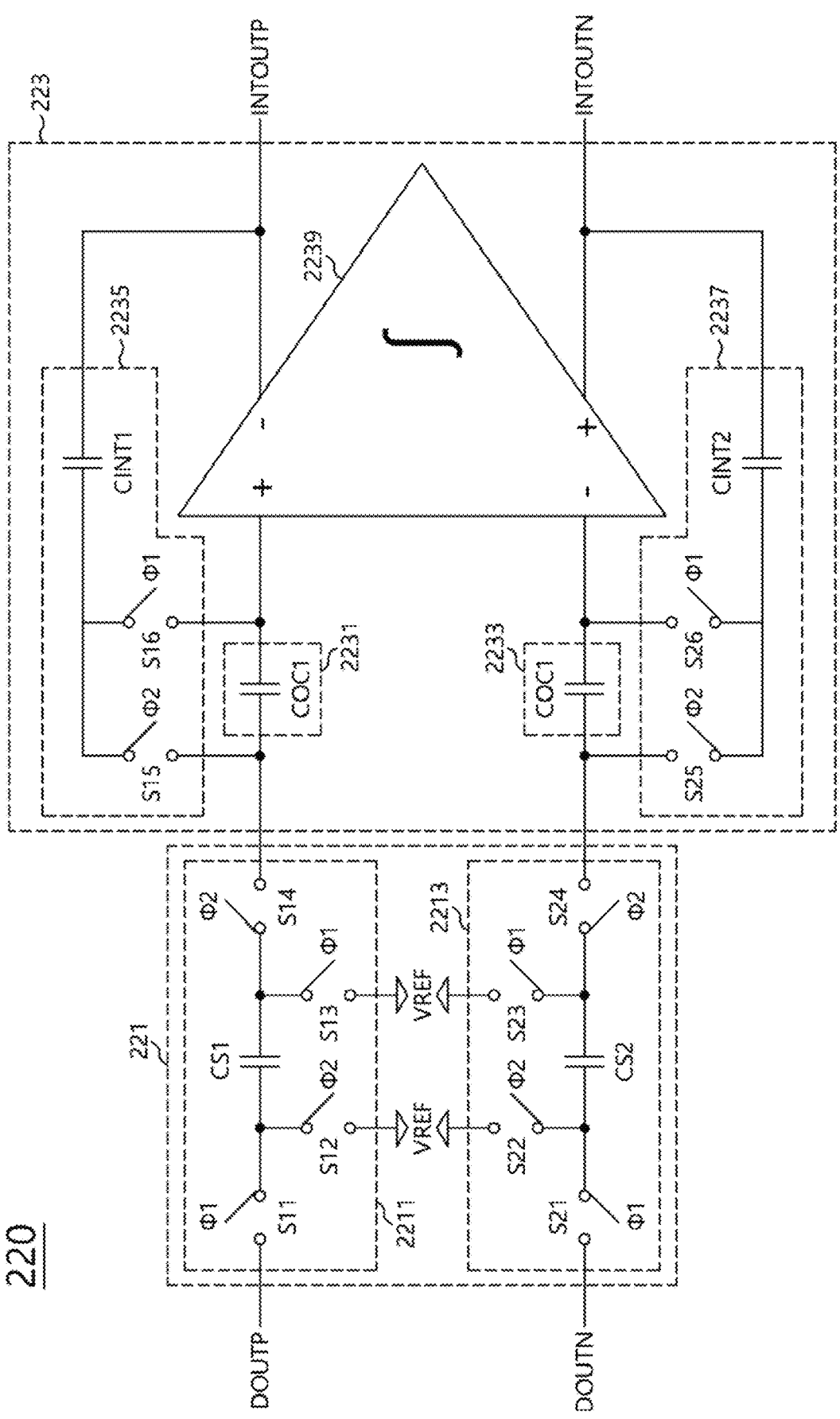
FIG. 4 illustrates a configuration of an integral circuit according to an embodiment.

FIG. 4 illustrates the configuration of the integral circuit 220 according to an embodiment.

Referring to FIG. 4, the integral circuit 220 may include a sampling unit 221 and an amplification integral unit 223.

The sampling unit 221 may be configured to receive a positive (+) input signal DOUTP, a negative (−) input signal DOUTN and a reference voltage VREF, sample the positive (+) input signal DOUTP and the negative (−) input signal DOUTN in response to a first control signal $\varphi 1$ and a second control signal $\varphi 2$, and output the sampled signals to the amplification integral unit 223.

The amplification integral unit 223 may be configured to integrate sampled signals output by the sampling unit 221 and output the integral signal to a positive (+) output terminal INTOUTN and a negative (−) output terminal INTOUTP.

Referring to FIG. 4, the sampling unit 221 may include a first sampling switch S11 electrically coupled to a positive (+) input terminal and driven in response to the first control signal $\varphi 1$, a first output switch S12 electrically coupled between the first sampling switch S11 and an input stage for the reference voltage VREF and driven in response to the second control signal $\varphi 2$, a first sampling capacitor CS1 having one end electrically coupled to the first sampling switch S11, a second sampling switch S13 electrically coupled between the other end of the first sampling capacitor CS1 and the input stage for the reference voltage VREF and driven in response to the first control signal $\varphi 1$, and a second output switch S14 electrically coupled to the other end of the first sampling capacitor CS1 and driven in response to the second control signal $\varphi 2$. The first sampling switch S11, the first output switch S12, the first sampling capacitor CS1, the second sampling switch S13, and the second output switch S14 may configure a first sampling unit 2211.

The sampling unit 221 may further include a third sampling switch S21 electrically coupled to a negative (−) input terminal and driven in response to the first control signal $\varphi 1$, a third output switch S22 electrically coupled between the third sampling switch S21 and the input stage for the reference voltage VREF and driven in response to the second control signal $\varphi 2$, a second sampling capacitor CS2 having one end electrically coupled to the third sampling switch S21, a fourth sampling switch S23 electrically coupled between the other end of the second sampling capacitor CS2 and the input stage for the reference voltage VREF and driven in response to the first control signal $\varphi 1$, and a fourth output switch S24 electrically coupled to the other end of the second sampling capacitor CS2 and driven in response to the second control signal $\varphi 2$. The third sampling switch S21, the third output switch S22, the second sampling capacitor CS2, the fourth sampling switch S23 and the fourth output switch S24 may configure a second sampling unit 2213.

The first control signal $\varphi 1$ and the second control signal $\varphi 2$ may be signals having clock phases alternately and repeatedly output so that high level sections of the first control signal $\varphi 1$ and the second control signal $\varphi 2$ do not overlap each other.

Accordingly, in the section in which the phase of the first control signal $\varphi 1$ is at a high level, a difference between the input signals DOUTP and DOUTN and the reference voltage VREF may be sampled in the first and second sampling capacitors CS1 and CS2. Furthermore, in the section in which the phase of the second control signal $\varphi 2$ is at a high level, a voltage sampled in the first and second sampling capacitors CS1 and CS2 may be transmitted to and integrated in the amplification integral unit 223.

The amplification integral unit 223 may include a first offset cancellation unit 2231, a second offset cancellation unit 2233, a first integral unit 2235, a second integral unit 2237, and an amplification unit 2239.

The first integral unit 2235 may include a fifth output switch S15 electrically coupled to an output stage of the first sampling unit 2211 and driven in response to the second control signal φ2, a first integration capacitor CINT1 electrically coupled between the fifth output switch S15 and the negative (−) output terminal INTOUTP of the amplification unit 2239, and a fifth sampling switch S16 electrically coupled between the positive (+) input terminal of the amplification unit 2239 and the first integration capacitor CINT1 and driven in response to the first control signal φ1.

The first offset cancellation unit 2231 may include a first offset cancellation capacitor COC1 having one end electrically coupled to the output stage of the first sampling unit 2211 and the other end electrically coupled to the positive (+) input terminal of the amplification unit 2239.

The second integral unit 2237 may include a sixth output switch S25 electrically coupled to the output stage of the second sampling unit 2213 and driven in response to the second control signal φ2, a second integration capacitor CINT2 electrically coupled between the sixth output switch S25 and the positive (+) output terminal INTOUTN of the amplification unit 2239, and a the sixth sampling switch S26 electrically coupled between the negative (−) input terminal of the amplification unit 2239 and the second integration capacitor CINT2 and driven in response to the first control signal φ1.

The second offset cancellation unit 2233 may include a second offset cancellation capacitor COC2 having one end electrically coupled to the output stage of the second sampling unit 2213 and the other end electrically coupled to the negative (−) input terminal of the amplification unit 2239.

The amplification unit 2239 has differential outputs including an inverted output signal INTOUTP and a non-inverted output signal INTOUTN. An influence attributable to external noise can be excluded because the noise occurs in proportion to differential outputs.

Furthermore, a malfunction phenomenon attributable to a process parameter change can be compensated for by the first and second offset cancellation capacitors COC1 and COC2 disposed in the input stage of the amplification unit 2239.

Figure 5:
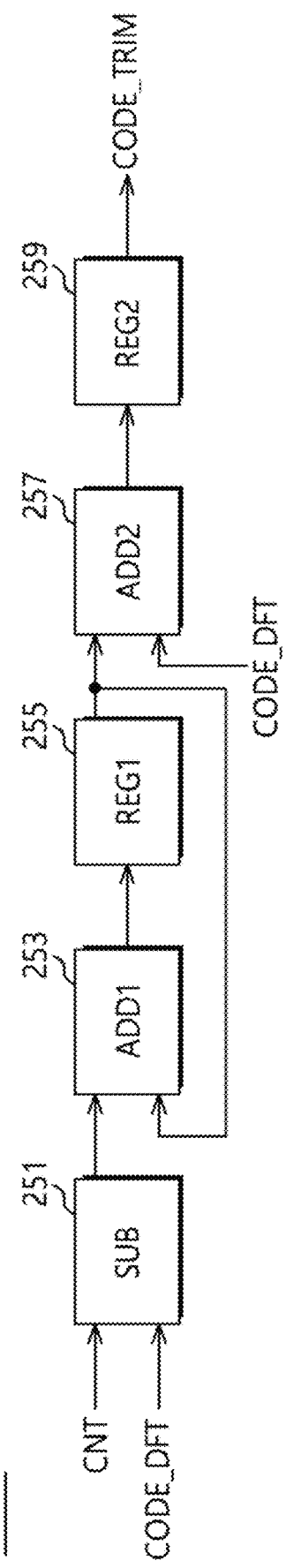
FIG. 5 illustrates a configuration of a code average signal generation circuit according to an embodiment.

FIG. 5 illustrates the configuration of the code average signal generation circuit 250 according to an embodiment.

Referring to FIG. 5, the code average signal generation circuit 250 may include a subtractor (SUB) 251, a first adder (ADD1) 253, a first register (REG1) 255, a second adder (ADD2) 257, and a second register (REG2) 259.

The subtractor 251 may detect a difference between an initial trimming code CODE_DFT and a preliminary trimming code CNT.

The first adder 253 may be configured to add the output signals of the subtractor 251 for a preset time.

The first register 255 may store the output signal of the first adder 253.

The second adder 257 may be configured to add the output signal of the first register 255 and the initial trimming code CODE_DFT.

The second register 259 may store the final trimming code CODE_TRIM, that is, the output signal of the second adder 257, and then may transmit the stored final trimming code CODE_TRIM to the DUT 210 and the storage 120.

Figure 6:
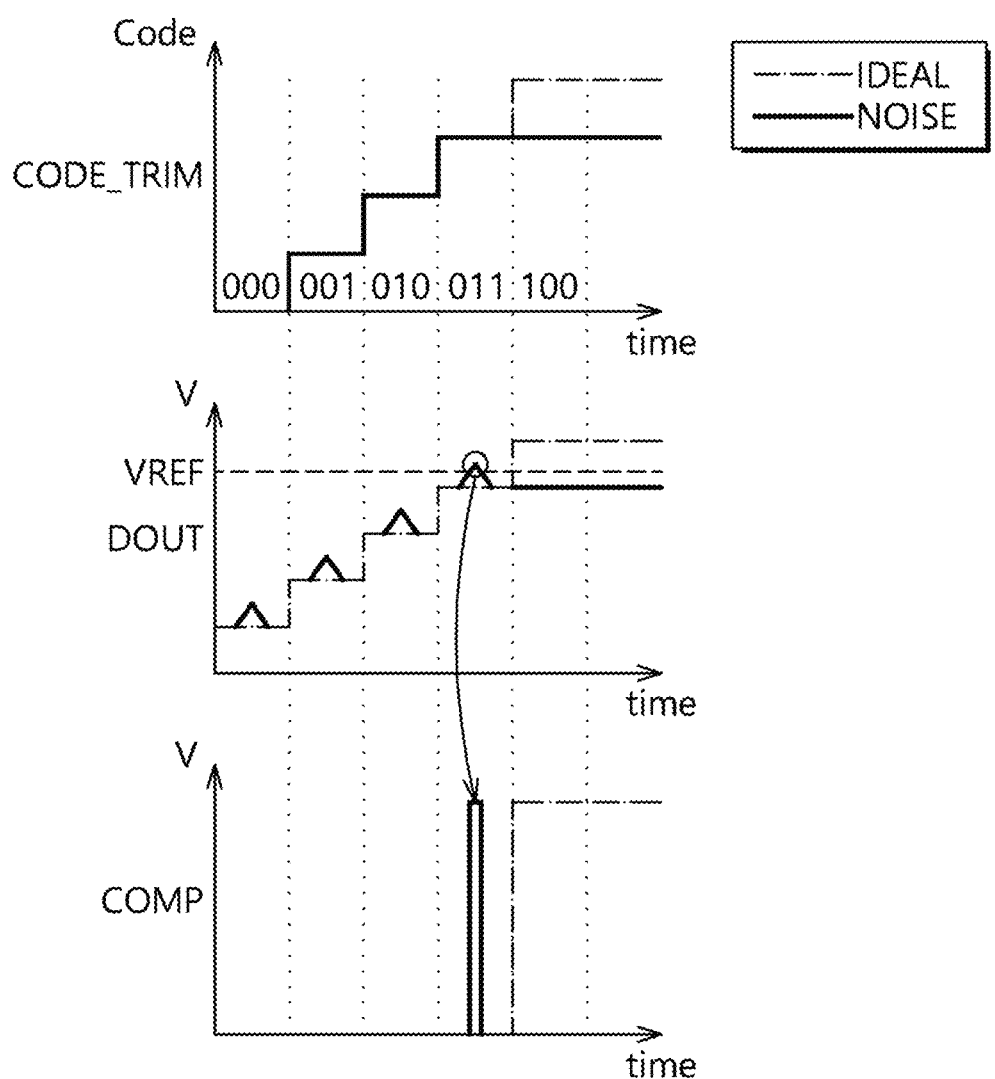
FIG. 6 is a diagram for illustrating an influence attributable to external noise introduced when a trimming code is detected.

FIG. 6 is a diagram for illustrating an influence attributable to external noise introduced when a trimming code is detected.

A general trimming code generation circuit may compare a target trimming voltage DOUT, output by a DUT based on a trimming code CODE_TRIM, with a reference voltage VREF; may detect an optimal trimming code while changing the trimming code based on a result of the comparison; and may store and use the detected trimming code.

If an output voltage DOUT of the DUT temporarily rises due to the inflow of external noise as illustrated in FIG. 6, a level of the output signal COMP of the comparison circuit temporarily shifts. As a result, an internal voltage having a target level cannot be generated because an erroneous trimming code value is stored as the final trimming code.

In contrast, for the present teachings, an output voltage of the DUT is not simply compared with a reference voltage, but a difference between the output voltage of the DUT and a reference voltage is sampled and integrated. Accordingly, a malfunction due to a temporary voltage rise attributable to the inflow of noise can be prevented or mitigated.

Figure 7:
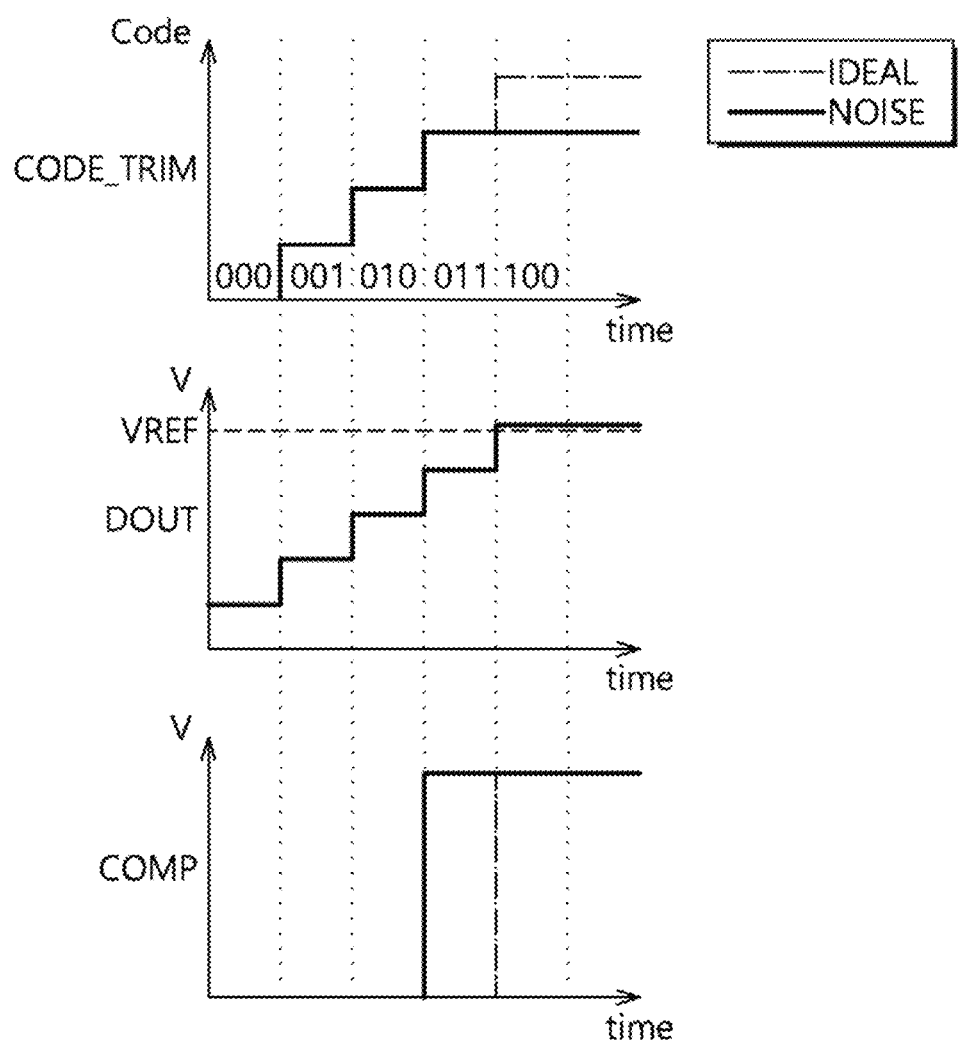
FIG. 7 is a diagram for illustrating an influence attributable to a process parameter change when a trimming code is detected.

FIG. 7 is a diagram for illustrating an influence attributable to a process parameter change when a trimming code is detected.

In a general trimming code generation circuit for comparing a target trimming voltage DOUT output by a DUT with a reference voltage VREF, an erroneous trimming code may be generated due to a process parameter change in a comparison circuit.

Referring to FIG. 7, an internal voltage having a target level cannot be generated because a level of a comparison signal COMP shifts even though an output voltage DOUT of the DUT is lower than a reference voltage VREF due to a process parameter change in a comparison circuit and thus an erroneous trimming code value is stored as the final trimming code.

The present teachings can prevent or mitigate a malfunction attributable to a process parameter change by stabilizing a sampled signal using the offset cancellation capacitors COC1 and COC2 before the sampled signal is provided to the integral unit when a difference between an output voltage DOUT of the DUT and a reference voltage VREF is sampled and integrated.

Figure 8:
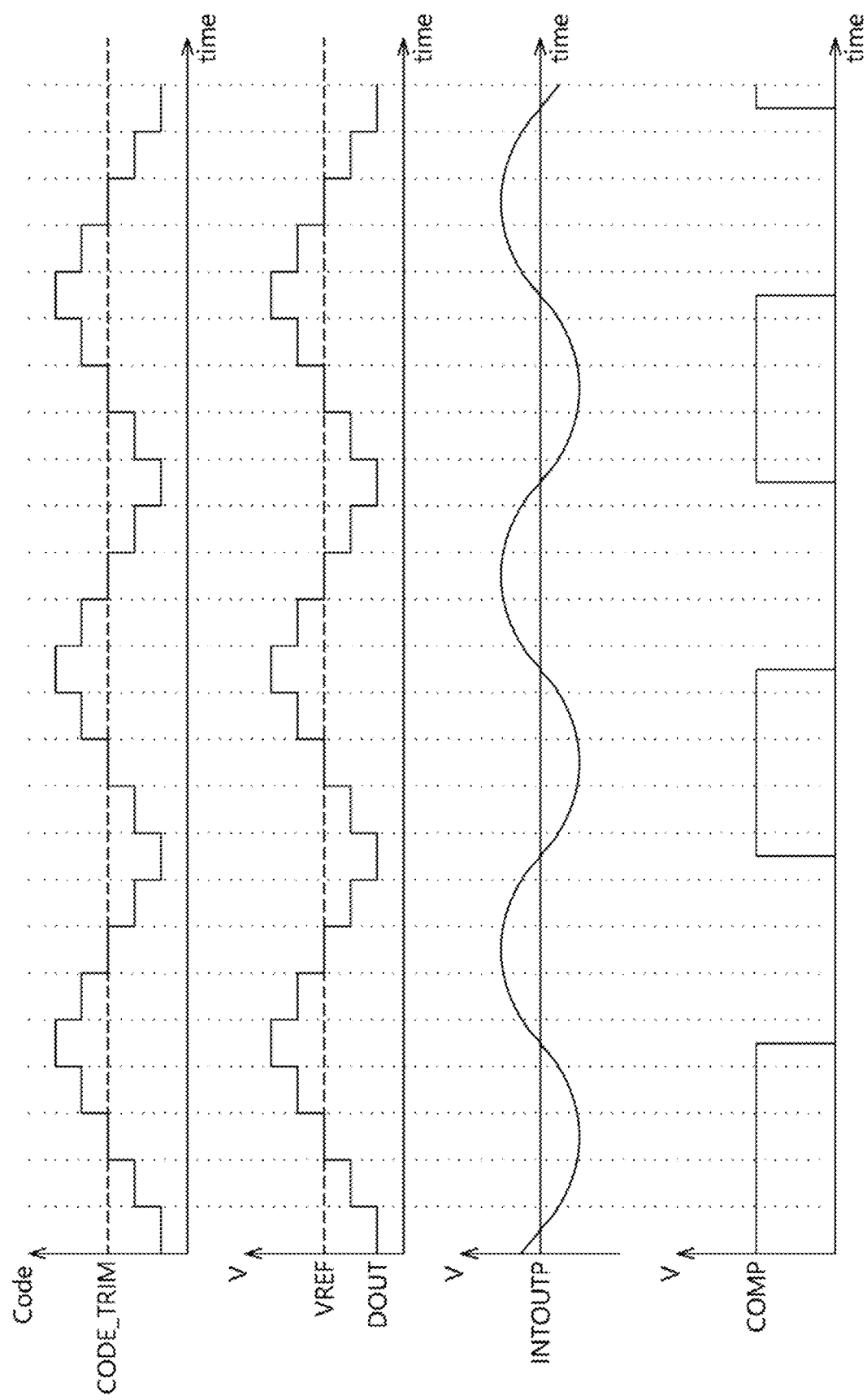
FIGS. 8 and 9 are timing diagrams for illustrating an operation of the internal voltage trimming circuit according to an embodiment.
Figure 9:
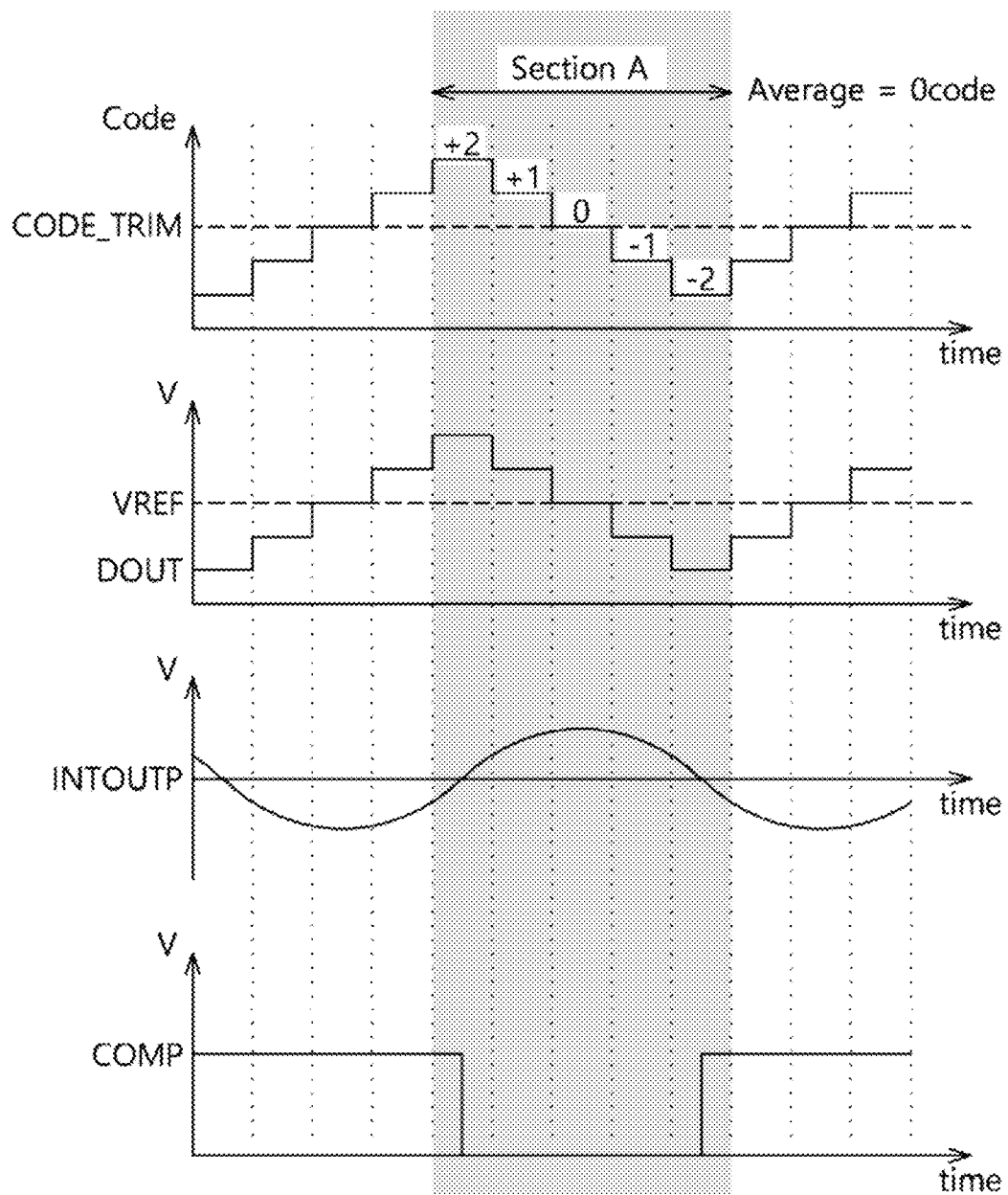

FIGS. 8 and 9 are timing diagrams for illustrating an operation of the internal voltage trimming circuit according to an embodiment.

An operation of the internal voltage trimming circuit according to the present teachings is described with reference to FIGS. 3 and 4 together with FIGS. 8 and 9.

When trimming is initiated, the DUT 210 may output a test voltage DOUT based on an initial trimming code CODE_DFT. The integral circuit 220 may receive differential input signals DOUTP and DOUTN, generated from the test voltage DOUT, and a reference voltage VREF, and may output differential integral signals INTOUTP and INTOUTN from which noise and an offset have been cancelled.

That is, the integral circuit 220 according to the present teachings can remove noise by sampling and integrating a difference between the input signals DOUTP and DOUTN and the reference voltage VREF, and can remove an error attributable to an offset by stabilizing a sampled signal before the sample signal is integrated.

The comparison circuit 230 may compare the output signal of the integral circuit 220 with the reference voltage VREF, and may output a comparison signal COMP having a logic high level if the test voltage DOUT is lower than the reference voltage VREF and thus the output of the integral circuit 220 drops. Accordingly, the code generation circuit 240 may raise the trimming code by 1 code. Likewise, if the output of the integral circuit 220 rises because the test voltage DOUT is higher than the reference voltage VREF, a logic level of the comparison signal COMP shifts to a low level. Accordingly, the code generation circuit 240 may drop the trimming code by 1 code.

In order to generate the final trimming code CODE_TRIM, preliminary trimming codes CNT output by the code generation circuit 240 may be averaged for a given time (e.g., section A) and generated as illustrated in FIG. 9.

The erroneous generation of a trimming code attributable to external noise and a process parameter change can be prevented because a trimming code is generated using the offset cancelled integrator.

Figure 10:
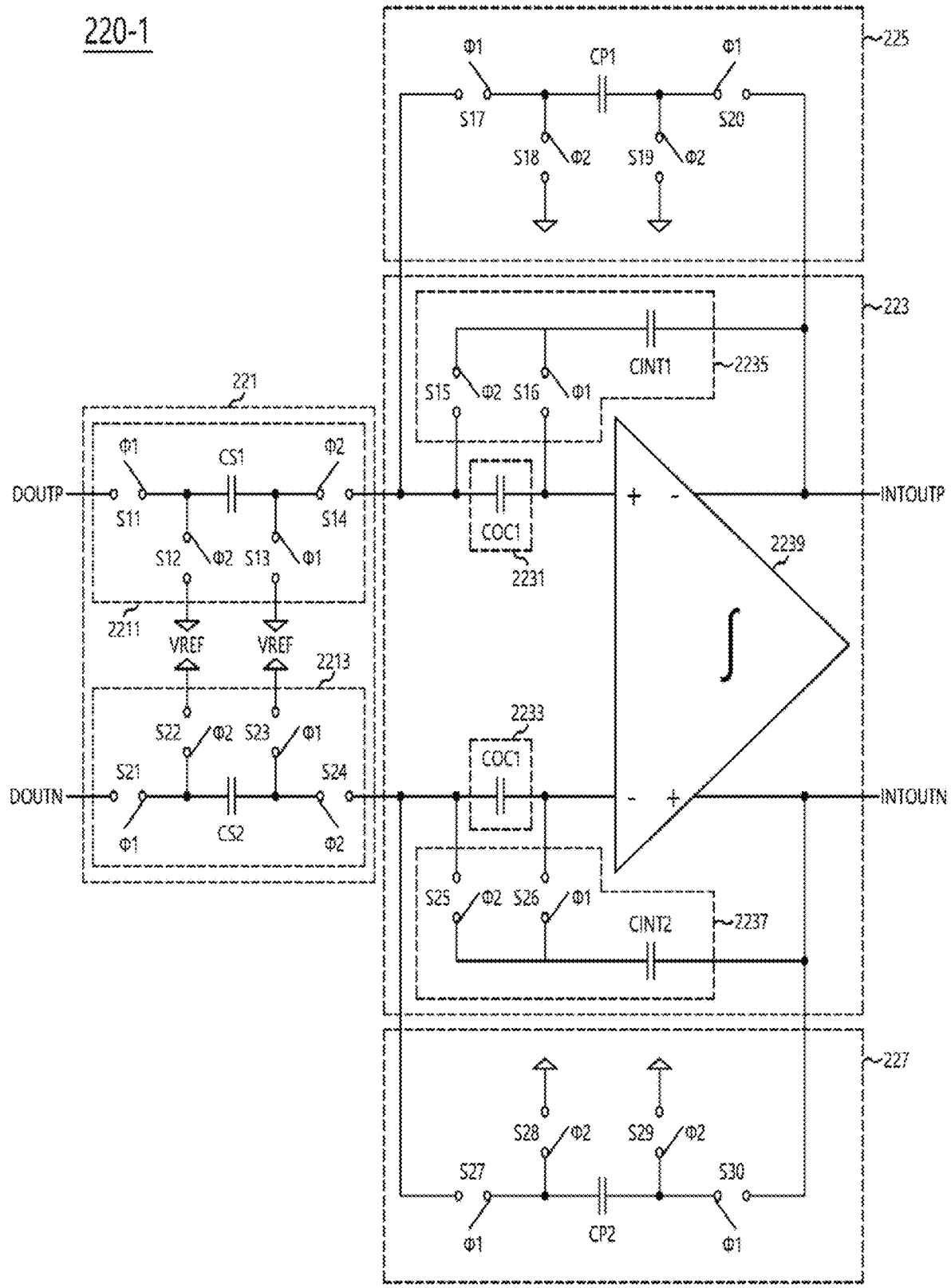
FIG. 10 illustrates a configuration of an integral circuit according to an embodiment.

FIG. 10 illustrates the configuration of an integral circuit 220-1 according to an embodiment.

Referring to FIG. 10, the integral circuit 220-1 may further include a first pole addition unit 225 electrically coupled between the first sampling unit 2211 and the negative (−) output terminal INTOUTP of the amplification unit 2239 and a second pole addition unit 227 electrically coupled between the second sampling unit 2213 and the positive (+) output terminal INTOUTN of the amplification unit 2239.

The first pole addition unit 225 may include a first pole switch S17 electrically coupled to the first sampling unit 2211 and driven in response to a first control signal φ1, a second pole switch S18 electrically coupled between the first pole switch S17 and a ground terminal and driven in response to a second control signal φ2, a first pole capacitor CP1 having one end electrically coupled to the second pole switch S18, a third pole switch S19 electrically coupled to the other end of the first pole capacitor CP1 and driven in response to the second control signal φ2, and a fourth pole switch S20 electrically coupled between the other end of the first pole capacitor CP1 and the negative (−) output terminal INTOUTP of the amplification unit 2239.

The second pole addition unit 227 may include a fifth pole switch S27 electrically coupled to the second sampling unit 2213 and driven in response to the first control signal φ1, a sixth pole switch S28 electrically coupled between the fifth pole switch S27 and the ground terminal and driven in response to the second control signal φ2, a second pole capacitor CP2 having one end electrically coupled to the second pole switch S28, a seventh pole switch S29 electrically coupled to the other end of the second pole capacitor CP2 and driven in response to the second control signal φ2, and an eighth pole switch S30 electrically coupled between the other end of the second pole capacitor CP2 and the positive (+) output terminal INTOUTP of the amplification unit 2239.

The integral circuit 220-1 illustrated in FIG. 10 adds a pole to an output signal and feeds the output signal back to an input stage thereof. Accordingly, a level of the output signal of the integral circuit 220-1 is formed near a level of a reference voltage VREF, that is, a common mode voltage, and thus a change in the trimming code can be minimized.

A value that satisfies a required pole may be selected as capacitance of the pole capacitors CP1 and CP2.

Figure 11:
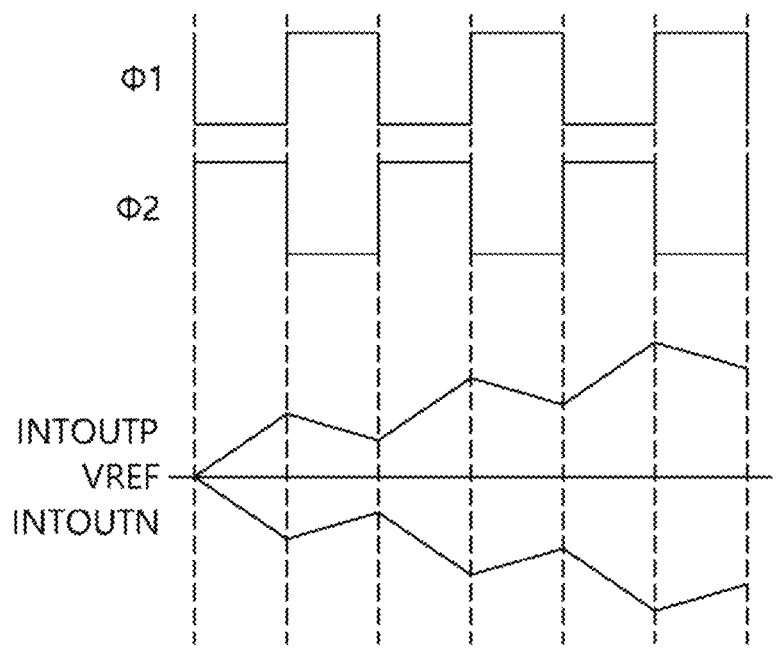
FIG. 11 is a waveform diagram for illustrating an operation of the integral circuit illustrated in FIG. 10.

FIG. 11 is a waveform diagram for illustrating an operation of the integral circuit illustrated in FIG. 10.

As illustrated in FIG. 11, the first control signal φ1 and the second control signal φ2 may be signals having clock phases that are alternately and repeatedly output so that high level sections of the first control signal φ1 and the second control signal φ2 do not overlap each other.

In the section in which the phase of the first control signal φ1 is at a high level, a voltage corresponding to a difference between the test signals DOUTP and DOUTN and the reference voltage VREF may be sampled.

In the section in which the phase of the second control signal φ2 is at a high level, a sampled voltage is integrated, so that differential integral signals INTOUTP and INTOUTN may be output.

Voltage levels of the differential integral signals INTOUTP and INTOUTN have a shape converging on a level near the reference voltage VREF, that is, a common mode voltage, during the section in which the first control signal φ1 is at a high level.

In particular, the output voltage DOUT of the DUT is changed by the poles inserted into the first and second pole addition units 225 and 227. Accordingly, when a difference value (i.e., sampling value) between the output voltage DOUT of the DUT and the reference voltage VREF is changed, the output of the integral circuit can converge on a level near the reference voltage VREF. As a result, a change in the output level of the comparison circuit 230 is reduced, and a change in the trimming code CODE_TRIM is minimized.

Figure 12:
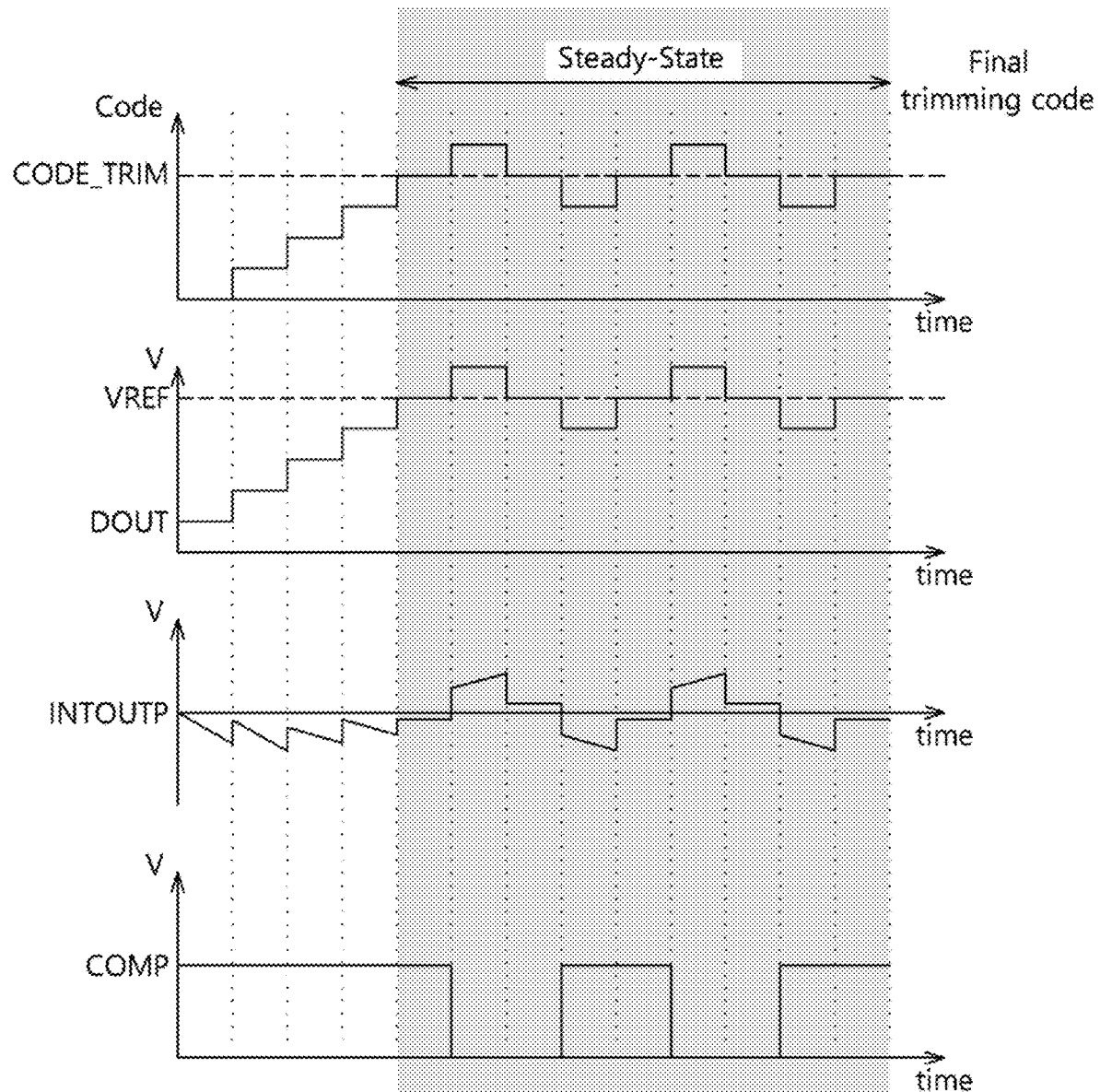
FIG. 12 is a timing diagram for illustrating an operation of the internal voltage trimming circuit to which the integral circuit of FIG. 10 has been applied.

FIG. 12 is a timing diagram for illustrating an operation of the internal voltage trimming circuit to which the integral circuit of FIG. 10 has been applied.

Referring to FIG. 12, a level of an integral signal INTOUTN generated by integrating a difference between an output voltage DOUT of the DUT and a reference voltage VREF shifts in synchronization with a change in a level of the output voltage DOUT of the DUT.

When FIG. 12 is compared with FIG. 8, it can be seen that a change in the trimming code CODE_TRIM has been reduced.

Accordingly, by introducing the first and second pole addition units 225 and 227 into the integral circuit 220, the size of the internal voltage trimming circuit 20 can be reduced because a computational load for deriving the final trimming code CODE_TRIM can be reduced.

Figure 13:
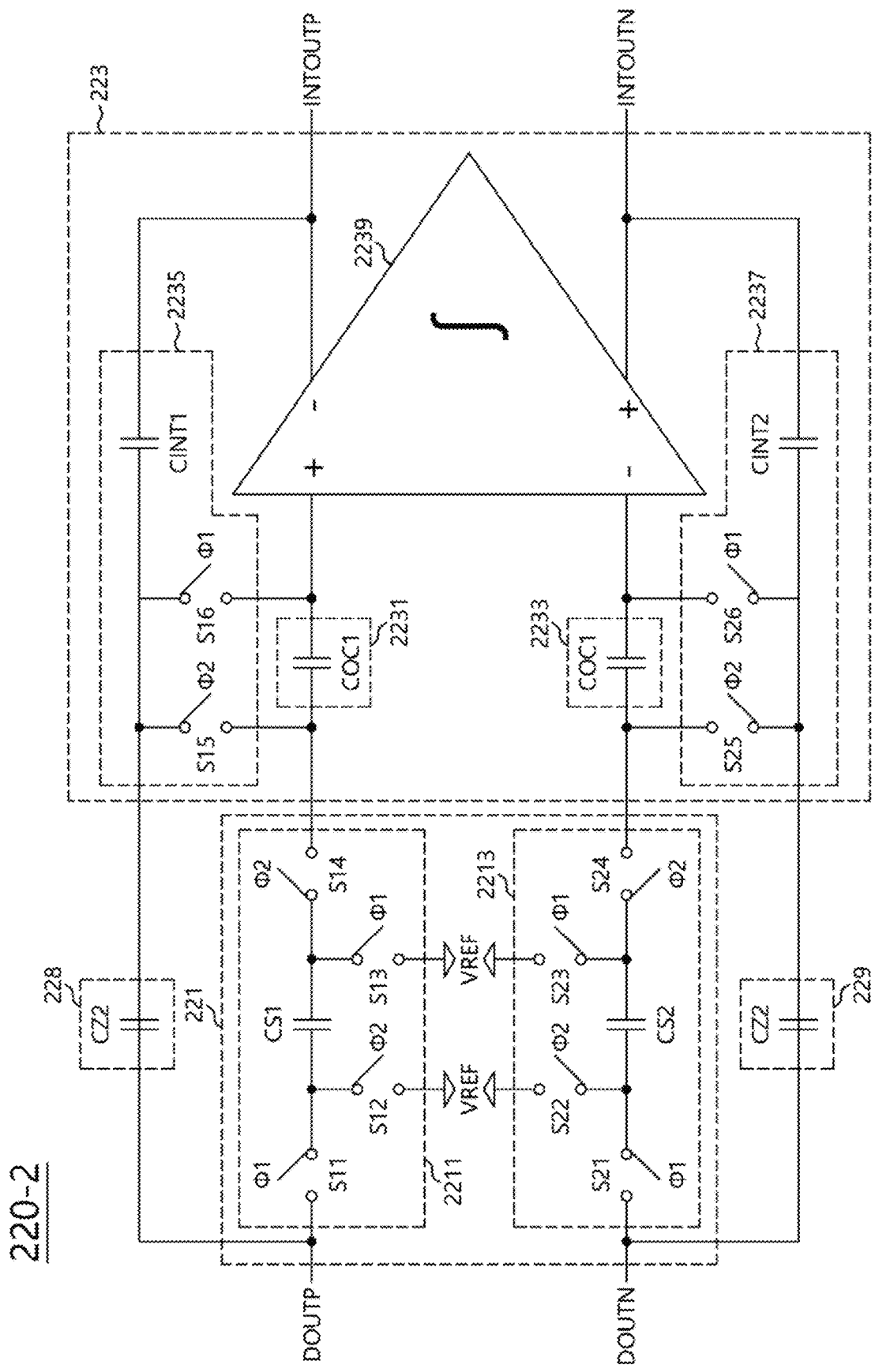
FIG. 13 illustrates a configuration of an integral circuit according to an embodiment.

FIG. 13 illustrates the configuration of an integral circuit 220-2 according to an embodiment.

Referring to FIG. 13, the integral circuit 220-2 according to an embodiment may further include a first zero addition unit 228 and a second zero addition unit 229 in addition to the components of the integral circuit 220 illustrated in FIG. 4.

The first zero addition unit 228 may include a first zero capacitor CZ1 electrically coupled between the input stage of the first sampling unit 2211 and the first integral unit 2235.

The second zero addition unit 229 may include a second zero capacitor CZ2 electrically coupled between the input stage of the second sampling unit 2213 and the second integral unit 2237.

A change in the trimming code CODE_TRIM can be minimized because a response characteristic of the integral circuit 220-2 converges on a level near a reference voltage VREF in the section in which the phase of the first control signal φ1 is at a high level by the first and second zero addition units 228 and 229.

While various embodiments have been described above, it will be understood by those skilled in the art that the described embodiments serve as examples only and represent a limited number of possible embodiments. Accordingly, the apparatus, circuit, and method described herein should not be limited based on the described embodiments.

What is claimed is:

1. A data storage apparatus comprising:
   storage; and
   a controller comprising an internal voltage trimming circuit and configured to control the storage in response to a request from a host,
   wherein the internal voltage trimming circuit comprises:
      an integral circuit configured to sample a difference between a test voltage output by a device under test (DUT) and a reference voltage and configured to generate an integral signal by integrating a sampled signal, the integral circuit comprising an offset cancellation unit configured to cancel an offset from the sampled signal;
      a comparison circuit configured to generate a comparison signal by comparing the integral signal with the reference voltage;
      a code generation circuit configured to receive an initial trimming code and to generate preliminary trimming codes by increasing or decreasing the initial trimming code in response to the comparison signal; and
      a code average signal generation circuit configured to generate a final trimming code by averaging the preliminary trimming codes for a given time and to provide the final trimming code to the storage.

2. The data storage apparatus according to claim 1, wherein the integral circuit further comprises pole addition units configured to allow an output level of the integral signal to converge on a level of the reference voltage during a sampling cycle.

3. The data storage apparatus according to claim 1, wherein the integral circuit further comprises zero addition units configured to allow an output level of the integral signal to converge on a level of the reference voltage during the sampling cycle.

4. The data storage apparatus according to claim 1, wherein the integral circuit comprises:
   a first sampling unit configured to receive a first input signal generated from the test voltage and to sample a difference between the first input signal and the reference voltage in response to a first control signal and a second control signal having phases alternately and repeatedly output so that high level sections of the first input signal and the second input signal do not overlap each other;
   a first offset cancellation unit electrically coupled to an output stage of the first sampling unit;
   a second sampling unit configured to receive a second input signal generated from the test voltage and to sample a difference between the second input signal and the reference voltage in response to the first control signal and the second control signal, wherein the second input signal is a differential signal of the first input signal;
   a second offset cancellation unit electrically coupled to an output stage of the second sampling unit;
   an amplification unit configured to receive an output signal of the first offset cancellation unit, output a first integral signal by amplifying the output signal, receive an output signal of the second offset cancellation unit, and output a second integral signal by amplifying the output signal;
   a first integral unit electrically coupled between the output stage of the first sampling unit and an output stage for the first integral signal; and
   a second integral unit electrically coupled between the output stage of the second sampling unit and an output stage for the second integral signal.

5. The data storage apparatus according to claim 4, further comprising:
   a first pole addition unit electrically coupled between the output stage of the first sampling unit and the output stage for the first integral signal; and
   a second pole addition unit electrically coupled between the output stage of the second sampling unit and the output stage for the second integral signal.

6. The data storage apparatus according to claim 4, further comprising:
   a first zero addition unit electrically coupled between an input stage of the first sampling unit and the first integral unit; and
   a second zero addition unit electrically coupled between an input stage of the second sampling unit and the second integral unit.

7. An internal voltage trimming circuit for providing a trimming code for generating an internal voltage of a semiconductor apparatus, the internal voltage trimming circuit comprising:
   an integral circuit configured to sample a difference between a test voltage output by a device under test (DUT) and a reference voltage and configured to generate an integral signal by integrating a sampled signal, the integral circuit comprising an offset cancellation unit configured to cancel an offset from the sampled signal;
   a comparison circuit configured to generate a comparison signal by comparing the integral signal with the reference voltage;
   a code generation circuit configured to receive an initial trimming code and to generate preliminary trimming codes by increasing or decreasing the initial trimming code in response to the comparison signal; and
   a code average signal generation circuit configured to generate a final trimming code by averaging the preliminary trimming codes for a given time and to provide the final trimming code to the semiconductor apparatus.

8. The internal voltage trimming circuit according to claim 7, wherein the integral circuit further comprises pole addition units configured to allow an output level of the integral signal to converge on a level of the reference voltage during a sampling cycle.

9. The internal voltage trimming circuit according to claim 7, wherein the integral circuit further comprises zero addition units configured to allow an output level of the integral signal to converge on a level of the reference voltage during the sampling cycle.

10. The internal voltage trimming circuit according to claim 7, wherein:
    the semiconductor apparatus is a storage apparatus configured to input or output data under a control of a controller, and
    the internal voltage trimming circuit is included in the controller as a built-in self-test (BIST) apparatus.

11. A trimming method of an internal voltage trimming circuit for generating an internal voltage of a semiconductor apparatus, the trimming method comprising:
    sampling a difference between a test voltage output by a device under test (DUT) and a reference voltage;
    cancelling an offset from the sampled signal;
    generating an integral signal by integrating the sampled signal from which the offset has been cancelled;

generating a comparison signal by comparing the integral signal with the reference voltage;
generating preliminary trimming codes by increasing or decreasing an initial trimming code in response to the comparison signal;
generating a final trimming code by averaging the preliminary trimming codes for a given time; and
providing the final trimming code to the semiconductor apparatus.

12. The trimming method according to claim 11, further comprising allowing an output level of the integral signal to converge on a level of the reference voltage during a sampling cycle.

* * * * *